Figure 1:
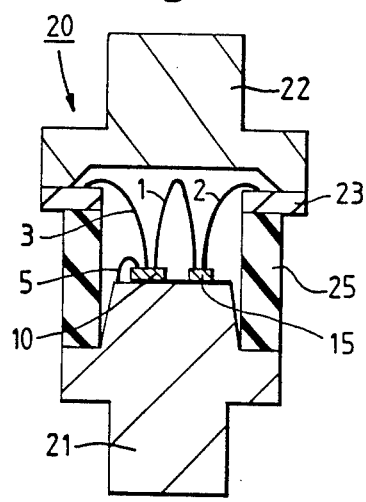

United States Patent [19]

Jones

[11] Patent Number: 4,947,138
[45] Date of Patent: Aug. 7, 1990

[54] MICROWAVE OSCILLATOR DEVICES

[75] Inventor: Stewart B. Jones, Poynton, England
[73] Assignee: U.S. Philips Corp., New York, N.Y.
[21] Appl. No.: 361,526
[22] Filed: Jun. 5, 1989

[30] Foreign Application Priority Data

Jun. 22, 1988 [GB] United Kingdom ............... 8814889.5

[51] Int. Cl.⁵ ........................... H03B 5/18; H03B 7/14
[52] U.S. Cl. ....................................... 331/96; 331/115; 357/51
[58] Field of Search ............... 331/96, 107 DP, 108 D, 331/117 FE, 117 D, 132, 115; 357/51

[56] References Cited

U.S. PATENT DOCUMENTS 4,768,079 8/1988 Kandpal et al. ..................... 357/74
4,841,353 6/1989 Wada et al. ....................... 331/115 X

*Primary Examiner*—David Mis
*Attorney, Agent, or Firm*—Emmanuel J. Lobato

[57] ABSTRACT

In a microwave oscillator device, wires (1,2,3 etc) form inductors in a feedback path between a control electrode (e.g. gate) and a second main electrode (e.g. source) of a transistor (e.g. a GaAs MESFET). The transistor body (10) is mounted within an insulating surround 25, on a base 21 providing a first device terminal. The connection to the second main electrode comprises in series at least first and second lengths (1,2) of wire, whereas the connection to the control electrode comprises a third length (3) of wire. The invention permits the construction of a mechanical and electrical replacement for a Gunn diode by compressing the wire lengths (1,2,3 etc) in a particular arrangement into the small space inside a conventional Gunn diode envelope (20). The first wire length (1) and possibly more lengths are arched onto a low bonding area (15,16,17) adjacent the base (21), whereas the second and third wire lengths extend upto an upper bonding area (23) adjacent the top of the surround (25) and connected to the second terminal (22). The resulting inductance of the connection (1,2, and possibly 4) between the second main electrode and the second terminal (22) is higher than the inductance of the connection (3) between the control electrode and the second terminal (22), which provides an impedance level equivalent to that of the Gunn diode which the device replaces.

14 Claims, 1 Drawing Sheet

U.S. Patent

Aug. 7, 1990

4,947,138

MICROWAVE OSCILLATOR DEVICES

This invention relates to microwave oscillator devices comprising a transistor body, particularly but not exclusively a Schottky-gate field-effect transistor (a so-called "MESFET") of gallium arsenide, with electrical connections including lengths of wire which form inductors in a feedback path. More particularly, the invention provides a two-terminal device of this form as a replacement for a Gunn diode.

In order to produce sustained steady-state oscillations at microwave frequencies, an active semiconductor device requires a negative-resistance characteristic. Such a negative resistance is inherent in devices such as Gunn diodes (also called transferred electron devices), IMPATT diodes and tunnel diodes and is obtained by simply applying a dc bias to the two electrodes of the device. In the case of transistors (both bipolar transistors and FETs) the negative-resistance state has to be simulated by suitable feedback between the electrodes of the transistor, and inductive connections are used for this purpose. The resulting arrangement may be a three-terminal or two-terminal device.

European patent application EP-A-O 156 708 discloses a microwave oscillator device comprising a transistor body (a FET in this case) having first and second main electrodes (source and drain) and a control electrode (gate); a microwave device envelope comprising an electrically insulating surround within which the transistor body is mounted on a base of the envelope; and electrical connections between the electrodes of the transistor and electrical terminals of the device. A first terminal is provided by the base, and a second terminal is carried by the surround. The connection to the second main electrode (source) comprises in series at least first and second lengths of wire. The connection to the control electrode comprises a third length of wire. At least the second and third lengths of wire form inductors in a feedback path between the control electrode and the second main electrode.

The oscillator of EP-A-O 156 708 includes a tuning circuit comprising a varicap diode connected to the source electrode of the FET by the first length of wire. This first length is kept as short as possible in this known device so as to have no significant inductance. The device envelope is that of a microwave transistor and has a third terminal which is also carried by the insulating surround. The base is of metal and forms an earth terminal of the device. The FET body and varicap body are mounted on a first capacitor on the base. A second capacitor and a resistor are also mounted on the base, beside the first capacitor. The top of the first capacitor is connected to the third terminal by one connection wire, and the drain of the FET is connected to the second terminal by another connection wire. The source electrode is connected by the very short first wire to the top of the varicap body, and the second wire extends from the top of the varicap body to the top of the second capacitor which effectively couples this second wire inductor to earth at microwave frequencies. The gate of the FET is connected directly to the earth terminal by the inductive third wire bonded to the metal base. This gate connection wire is longer than the first and second wire connections for the source of the FET and so provides a larger inductance in the gate connection. A further wire extends from the top of the second capacitor to the top of the resistor to form a bias circuit connected to earth.

The present invention is based on a recognition by the present inventor that a microwave oscillator device comprising a transistor body can be constructed as a replacement both electrically and mechanically for a Gunn diode by adopting within a microwave diode envelope a different and inverted connection arrangement in which the first main electrode is connected to the base terminal(instead of to the second terminal) and in which wire connections for both the control electrode and the second main electrode are isolated from the base and connected together electrically to the second terminal at the top of the surround so as to provide inductive feedback by way of a dc coupling in which the connection for the second main electrode comprises in series more than one upwardly-extending inductive length of wire (utilizing one or more bonding areas) so as to have a total inductance which is high compared with the inductance of the wire connection for the gate. Such an inverted connection arrangement permits long inductive lengths of wire to be compressed into a small space, and may be made readily compatible with the small space and the bonding areas available inside an envelope of conventional two-terminal outline for a Gunn diode. Such a device may perform as an electrical equivalent to a Gunn diode (having the same impedance as seen at the terminals) but with a higher efficiency in its dc to microwave conversion than a Gunn diode.

Thus, according to the present invention, there is provided a microwave oscillator device comprising a transistor body having first and second main electrodes and a control electrode, a microwave device envelope comprising an electrically insulating surround within which the transistor body is mounted on a base of the envelope, and electrical connections between the electrodes of the transistor body and electrical terminals of the device, of which a first terminal is provided by the base and of which a second terminal is carried by the surround, the connection to the second main electrode comprising in series at least first and second lengths of wire, the connection to the control electrode comprising a third length of wire, the second and third lengths of wire forming inductors in a feedback path between the control electrode and the second main electrode, which device is characterised in that the envelope comprises an upper bonding area which is present adjacent the top of the surround and which is electrically connected to the second terminal, and a lower bonding area which is present adjacent the base and which is electrically insulated from the first terminal, in that the first main electrode is connected to the first terminal, in that the first length of wire extends to the lower bonding area, and the second length of wire extends from the lower bonding area to the upper bonding area, and the third length of wire extends to the upper bonding area, and in that the connection of both the second and third lengths to the second terminal provides a dc coupling via the inductive feedback path in which the inductance of the connection between the second main electrode and the second terminal is higher than the inductance of the connection between the control electrode and the second terminal.

Further advantages of this arrangement of the terminals and wire connections in accordance with the present invention for a Gunn-diode type of envelope may be noted. By connecting the first main electrode (e.g. a FET drain) to the first (base) terminal and the second main electrode and control electrode to the second (upper) terminal, an inverted arrangement (as compared with that of EP-A-O 1 156 708) is obtained to permit a high inductance in the feed-back path, by facilitating accommodation (within the confined envelope space) of the first, second and possibly more lengths of wire in the connection to the second main electrode (e.g. a FET source). As a result, significant feed-back and substantial oscillator output power can be obtained without requiring the transistor to have a high gain. Furthermore, with this inverted arrangement, the voltage to be applied across the device terminals can be of the conventional polarity which is already used for a conventional Gunn diode envelope.

In order to increase the inductance in the connection for the second main electrode in a manner compatible with a small space inside the envelope, the first length of wire may be increased by arching the wire and/or more than one separate bonding area may be provided at the bottom of the available space for the inclusion of further wires in the series connection. Thus, the arrangement may be such that the lower bonding area comprises first and second separate areas which are present beside the transistor body, and that the connection to the second main electrode comprises the first length of wire extending from the electrode to the first area, the second length of wire extending from the second area to the upper bonding area, and a fourth length of wire extending from the first area to the second area. Preferably the fourth length of wire extends to a height which is above half (or even above three quarters of) the height of the upper bonding area above the base, thereby increasing the length (and hence the inductance) of the fourth length of wire. The first length of wire may extend to about the same height, thereby increasing the inductance of the first length.

The transistor body may comprise a bipolar transistor having a collector as the first main electrode, an emitter as the second main electrode, and a base as the control electrode. However, higher microwave performance can be obtained with a unipolar device such as a field-effect transistor, especially a FET formed in gallium arsenide or another III-V compound semiconductor material(s) having a high electron mobility. Thus, preferably, the transistor body comprises a Schottky-gate FET having drain and source main electrodes and a gate control electrode. In this case, the transistor body often comprises a substrate of semi-insulating material, and so a compatible manufacturing process can be adopted in which the lower bonding area provided in accordance with the invention comprises metallization on a substrate of the semi-insulating material having the same thickness as the substrate of the transistor body.

Figure 2:
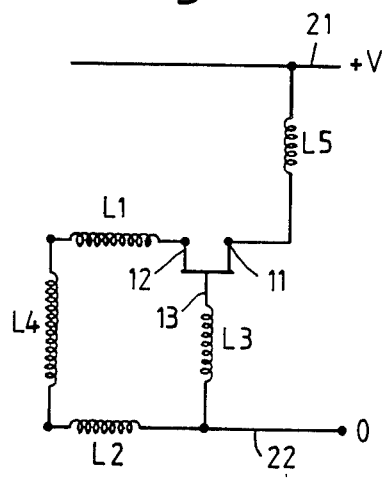
Figure 3:
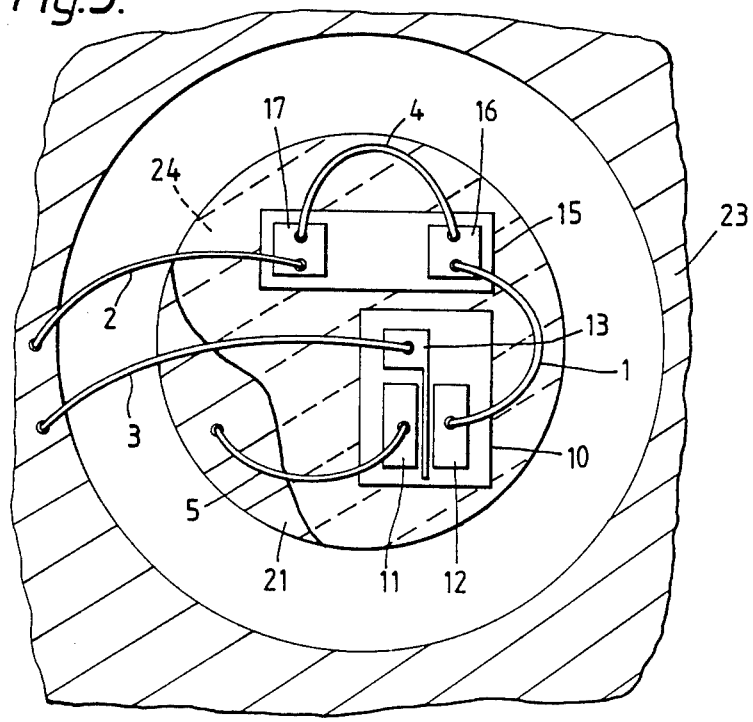

These and other features in accordance with the invention are illustrated, by way of example in a specific embodiment of the invention now to be described with reference to the accompanying diagrammatic drawings, in which:

FIG. 1 is a cross-sectional view of a microwave oscillator device in accordance with the invention, FIG. 2 is a circuit diagram of such a device as that of FIG. 1, and FIG. 3 is a view from above of the inside of the device envelope of such a device as that of FIG. 1.

It should be noted that the drawings are diagrammatic and not drawn to scale. The relative dimensions and proportions of parts of these drawings have been shown exaggerated or diminished for the sake of clarity and convenience in the drawings. Furthermore although no cross sections are included in FIG. 3, the upper surface of the metal ring and plinth of the envelope have been hatched and the hatching is broken where the plinth is coated with an adhesive, so as to facilitate visualization of these different parts in FIG. 3.

The microwave oscillator device of FIG. 1 comprises a transistor body 10 having first and second main electrodes 11 and 12 respectively (FIG. 3) and a control electrode 13. A microwave device envelope 20 comprises an electrically insulating surround 25 within which the transistor body 10 is mounted on a base 21 of the envelope. Electrical connections 1 to 5 are present between the electrodes of the transistor body 10 and electrical terminals 21 and 22 of the device. Of these a first terminal 21 is provided by the base, and a second terminal 22 is carried by the surround 25. The connection to the second main electrode 12 comprises in series at least first and second lengths of wire 1 and 2 respectively. The connection to the control electrode 13 comprises a third length of wire 3. The second and third lengths of wire 2 and 3 form inductors L2 and L3 (see FIG. 2) in a feedback path between the control electrode 13 and the second main electrode 12.

In accordance with the present invention, the envelope 20 comprises an upper bonding area 23 which is present adjacent the top of the surround 25 and which is electrically connected to the second terminal 22, and a lower bonding area 15,16,17 which is present adjacent the base 21 and which is electrically insulated from the first terminal 21. The first main electrode 11 is connected to the first terminal 21. The first length 1 of wire extends to the lower bonding area 15,16,17. The second length 2 of wire extends from the lower bonding area 15,16,17 to the upper bonding area 23. The third length of wire 3 extends to the upper bonding area 23. The connection of both the second and third lengths 2 and 3 to the second terminal 22 provides a dc coupling via the inductive feedback path (L1,L2,L3, and possibly L4) in which the inductance L1 and L2 (and possibly L4) of the connection 1,2 (and possibly 4) between the second main electrode 12 and the second terminal 22 is higher than the inductance L3 of the connection 3 between the control electrode 13 and the second terminal 22.

The device of FIG. 1 is an electrical and mechanical replacement for a Gunn diode. The envelope 20 diagrammatically illustrated in FIG. 1 can be of the same outline as one of the conventionally used Gunn diode envelopes such as, for example, the international standard SOD 31 type having a double-ended cylindrical geometry. The envelope base 21 provides the terminal to which the dc bias voltage (+V in FIG. 2) is applied at one end of the device. At the opposite end the envelope 20 comprises a cover 22 which is mounted on top of the insulating cylindrical surround 25 and which provides the earth terminal. Both the second and third lengths of wire 2 and 3 are connected to this second terminal 22 (and not to the base) which is the opposite situation to that of the oscillator in EP-A-O 156 708.

The envelope 20 may have the same structure as a conventional Gunn diode envelope. Thus, the base 21 may be of metal (for example gold-plated copper) forming the first terminal at one end of the insulating surround 25; the transistor body 10 may be mounted on a plinth of this base 21; the surround 25 may be of ceramic (for example alumina) and may have a metal ring 23 (for example "Kovar" Trade Mark) forming a flange at the top of the surround 25; the connections 1 to 5 may be, for example, gold wires; the wires 2 and 3 can be bonded in known manner to the ring 23, and the cover terminal 22 of metal (for example gold-plated copper) may be welded to the ring 23. By appropriately choosing the length of the upwardly-extending wire 3 to give a desired inductance value L3 for the control connection and by choosing the lengths of the upwardly-extending wires 1 and 2 (and possibly one or more extra wires e.g. 4) to give a much higher inductance value for this main connection, the oscillator device can have an electrical performance resembling that of a Gunn diode with the same microwave impedances seen at its terminals 21 and 22 but with a high efficiency in dc to microwave conversion (typically 10 to 30 percent, as compared with 1 to 3 percent for a Gunn diode). The appropriate circuit diagram with inductive feedback between electrodes 13 and 12 is shown in FIG. 2.

In the form illustrated in FIGS. 1 to 3 the transistor body 10 comprises a Schottky-gate field-effect transistor, for example a gallium arsenide MESFET, having drain electrode 11, source electrode 12 and gate electrode 13. These electrodes 11 to 13 may comprise gold, for example. Typically the transistor body 10 comprises the active transistor structure formed in and on an epitaxial layer of n-type semiconducting gallium arsenide on a substrate of semi-insulating material, for example chromium-doped gallium arsenide. This body 10 may be attached to the base 21 by an intermediate layer 24 of, for example, an insulating epoxy or other adhesive. In order to maximize the length of the wires 1,2 etc for the source connection, it is advantageous to provide the lower bonding area 15,16,17 on the base 21, and it is convenient to mount it in the same manner as the transistor body so as to be at substantially the same height for wire bonding as are the electrodes of the transistor body 10. Thus, in this example illustrated in FIGS. 1 and 2, the bonding area 15,16,17 may comprise metallization 16,17 (for example gold) on a substrate 15 of the same semi-insulating material and same thickness as the substrate of the transistor body. This substrate 15 may be a lateral extension of the substrate of the transistor body 10, or it may be a separate substrate (as illustrated in FIGS. 1 and 3) separately attached to the base 21 by an intermediate adhesive layer 24.

An arrangement may be adopted in which the source connection comprises only the first and second lengths of wire 1 and 2 extending to and from one lower bonding area, the length 1 being increased by arching upwards in the available space below the cover 22 (as illustrated in FIG. 1) so as to form a significant inductance L1 for the first wire 1. In this way, the inductance L1 may even be chosen to be larger than the inductance L3 of the gate connection 3, so that the total inductance (L1+L2) of the source connection 1,2 in the feedback path is more than two times larger than the inductance L3 of the gate connection. This is the opposite situation to that of the oscillator device of EP-A-O 156 708.

In order to increase further the inductance of the source connection within the vertically confined spaced inside the envelope 20 and/or in order to reduce the height to which the first wire 1 is arched, it is advantageous to adopt the arrangement of FIG. 3. As illustrated in FIG. 3, the lower bonding area 15,16,17 comprises separate first and second metallization areas 16 and 17 respectively, beside the transistor body 10. The connection to the second main electrode 12 in this case now comprises the first length of wire 1 extending from the electrode 12 to the first bonding area 16, the second length of wire 2 extending from the second bonding area 17 to the top of the surround 25, and a fourth length of wire 4 extending from the first bonding area 16 to the second bonding area 17. In the arrangement shown in FIG. 3, these separate metallization areas 16 and 17 are provided on the same substrate 15, but they may be provided on separate substrates. Although separate wires 1,4,2 are shown, the lengths 1,4 and 2 may be formed by a single wire stitch-bonded so as to hop between the areas 12,16,17 and 23.

The arched wires 1 and 4 may extend to substantially the same height in the envelope space and this facilitates their provision in the wire bonding operation, particularly with stitch-bonding. In order to obtain high inductance values L1 and L4, the wires 1 and 4 may be arched to a height above the base 21 in excess of half (and even three quarters) of the height of the upper bonding area 23 above the base 21. The maximum height to which the wires 1 and 4 can be arched may be determined by the reliability and reproducibility of the wire bonding operation which are achievable with the particular bonding machine used and the particular form of wire used, as well as the shape of the envelope space. In the particular example illustrated in FIG. 1, there is a recess in the underside of the cover 22 which provides more space so that the wire 1 (and wire 4) may even be arched to a height near or above the top of the upper bonding area 23.

In a particular example of a device to replace an X-band Gunn diode oscillating at a frequency of about 10GHz, and based on a gallium arsenide MESFET the total inductance L1,L2 (and possibly L4) of the source connection 1,2 (and possibly 4) may be about 3nH, and the inductance L3 of the gate connection 3 may be about 1nH, whereas the inductance L5 in the drain connection 5 is very much less, for example about 0.5nH. Assuming the use of gold wire having a circular cross-section of diameter about 18 micrometers, an inductance of about 1nH per mm of the wire is obtained. The height inside the envelope 20, between the plinth of the base 21 and the top of the bonding ring 23 may be about 0.75 mm, and the bodies 10 and 15 may each be about 0.1 mm high. Thus, the wires 2 and 3 may each have a length of about 1 mm and hence an inductance of about 1 nH, and the remaining inductance (about 2 nH) required for the source connection may be obtained by using two lengths 1 and 4 of wire which may be arched to a lower height in the envelope space. It should be noted that the lengths of wire 1,2,3 etc in the source and gate connections of the FET of FIGS. 1 to 3 determines the impedance levels and the degree of negative resistance, and that this connection arrangement results in a broad-band oscillator which oscillates at a frequency determined by the dimensions of a resonant waveguide cavity in which the device is mounted in operation. By contrast, the connection arrangement of the FET of EP-A-O 156 708 (having varactor tuning in the source connection and a higher inductance in the gate connection than in the source connection) results in an oscillator whose frequency is determined by the inductance (wire length) in the source connection.

It will be evident to a person skilled in the art, from reading the foregoing description, that many modifications are possible within the scope of the present invention. Thus, for example, instead of having a circular cross-section, wires 1 to 5 may be employed with other shaped cross-sections if desired, for example a rectangular cross-section for at least some of the wires 1 to 5 so that these wires may have the nature of straps. Instead of a metal ring, the upper bonding area 23 may be provided in some other manner, for example as a metallization layer on a surface of the insulating surround 25 on the top of the surround 25 or for example on a ledge near the top of the surround 25. The lower bonding area 15.16,17 for the source connection wires may be provided on a different surface from the top of the plinth on which the transistor body 10 is mounted. Thus, for example, the lower bonding area may be metallization provided on a low ledge of the insulating surround 25 adjacent the base 21, or it may be mounted on a lower ledge of the base 21 while still being electrically insulated from the first terminal.

It should be noted that, whereas the source connection wires in the oscillator of EP-A-O 156 708 were coupled electrically to the base terminal by capacitors, the source connection wires 1,2,4 in the oscillator of the present invention are insulated from the base terminal 21 (both at dc and microwave frequencies) and are dc coupled to the upper earth terminal 22. Although the cover 22 and base 21 are formed wholly of metal in a conventional microwave device envelope, other constructions could be used in which part of the cover 22 and/or base 21 is electrically insulating whereas another part is electrically conductive and forms the terminal connections of the device.

Although a MESFET is illustrated in FIGS. 2 and 3, the transistor body 10 in an oscillator in accordance with the present invention may comprise a bipolar transistor. In this case, the transistor may have its emitter and base electrodes 12 and 13 respectively at the top surface of the body and its collector electrode !1 at the bottom surface. Such a bipolar transistor body may be mounted on a metallised surface of the metal base 21 so as to form a direct connection between the collector electrode 11 and the device terminal 21 without requiring a wire 5.

The dc path between the source and gate electrodes 12 and 13 may include a resistor (for example between wires 2 and 4) to set a desired bias condition for the transistor. In this case a decoupling capacitor is coupled in parallel with the resistor. However such a bias arrangement complicates a device in accordance with the invention and adds to its expense.

From reading the present disclosure, other modifications will be apparent to persons skilled in the art. Such modifications may involve other features which are already known in the design, manufacture and use of microwave oscillator systems, semiconductor devices, and component parts thereof, and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation thereof, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

I claim:

1. A microwave oscillator device comprising a transistor body having first and second main electrodes and a control electrode, a microwave device envelope comprising an electrically insulating surround within which the transistor body is mounted on a base of the envelope, and electrical connections between the electrodes of the transistor body and electrical terminals of the device, of which a first terminal is provided by the base and of which a second terminal is carried by the surround, the connection to the second main electrode comprising in series at least first and second lengths of wire, the connection to the control electrode comprising a third length of wire, the second and third lengths of wire forming inductors in a feedback path between the control electrode and the second main electrode, characterised in that the envelope comprises an upper bonding area which is present adjacent the top of the surround and which is electrically connected to the second terminal, and a lower bonding area which is present adjacent the base and which is electrically insulated from the first terminal, in that the first main electrode is connected to the first terminal, in that the first length of wire extends to the lower bonding area, and the second length of wire extends from the lower bonding area to the upper bonding area, and the third length of wire extends to the upper bonding area, and in that the connection of both the second and third lengths to the second terminal provides a dc coupling via the inductive feedback path in which the inductance of the connection between the second main electrode and the second terminal is higher than the inductance of the connection between the control electrode and the second terminal.

2. A device as claimed in claim 1, further characterised in that the lower bonding area comprises first and second separate areas which are present beside the transistor body, and in that the connection to the second main electrode comprises the first length of wire extending from the electrode to the first area, the second length of wire extending from the second area to the upper bonding area, and a fourth length of wire extending from the first area to the second area.

3. A device as claimed in claim 2, further characterised in that the fourth length of wire extends to a height which is above half the height of the upper bonding area above the base.

4. A device as claimed in claim 1, further characterised by the envelope comprising a cover which is mounted on the top of the surround and which provides the second terminal to which both the second and third lengths of wire are connected.

5. A device as claimed in claim 1, further characterised in that the transistor body comprises a Schottky-gate field-effect transistor having drain and source main electrodes and a gate control electrode.

6. A device as claimed in claim 5, further characterised in that the transistor body comprises a substrate of semi-insulating material, and in that the lower bonding area comprises metallization on a substrate of the semi-insulating material having substantially the same thickness as the substrate of the transistor body.

7. A device as claimed in claim 2, further characterized by the envelope comprising a cover which is mounted on the top of the surround and which provides the second terminal to which both the second and third lengths of wire are connected.

8. A device as claimed in claim 3, further characterized by the envelope comprising a cover which is mounted on the top of the surround and which provides the second terminal to which both the second and third lengths of wire are connected.

9. A device as claimed in claim 2, further characterized in that the transistor body comprises a Schottky-gate field-effect transistor having drain and source main electrode and a gate control electrode.

10. A device as claimed in claim 9, further characterized in that the transistor body comprises a substrate of semi-insulating material, and in that the lower bonding area comprises metallization on a substrate of the semi-insulating material having substantially the same thickness as the substrate of the transistor body.

11. A device as claimed in claim 3, further characterized in that the transistor body comprises a Schottky-gate field-effect transistor having drain and source main electrodes and a gate control electrode.

12. A device as claimed in claim 11, further characterized in that the transistor body comprises a substrate of semi-insulating material, and in that the lower bonding area comprises metallization on a substrate of the semi-insulating material having substantially the same thickness as the substrate of the transistor body.

13. A device as claimed in claim 4, further characterized in that the transistor body comprises a Schottky-gate field-effect transistor having drain and source main electrodes and a gate control electrode.

14. A device as claimed in claim 13, further characterized in that the transistor body comprises a substrate of semi-insulating material, and in that the lower bonding area comprises metallization on a substrate of the semi-insulating material having substantially the same thickness as the substrate of the transistor body.

* * * * *